(12) United States Patent
Balaz et al.

(10) Patent No.: US 11,515,785 B2
(45) Date of Patent: Nov. 29, 2022

(54) MULTI-CAPACITOR BOOTSTRAP CIRCUIT

(71) Applicant: Texas Instruments Incorporated, Dallas, TX (US)

(72) Inventors: Pavol Balaz, Freising (DE); Hongcheng Xu, Freising (DE); Ferdinand Stettner, Dachau (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/361,852

(22) Filed: Jun. 29, 2021

(65) Prior Publication Data

US 2021/0328508 A1   Oct. 21, 2021

Related U.S. Application Data

(63) Continuation of application No. 16/690,034, filed on Nov. 20, 2019, now Pat. No. 11,095,215.

(60) Provisional application No. 62/771,458, filed on Nov. 26, 2018.

(51) Int. Cl.
*H02M 3/07*   (2006.01)
*H03K 19/017*   (2006.01)
*H03K 19/20*   (2006.01)

(52) U.S. Cl.
CPC ...... *H02M 3/073* (2013.01); *H03K 19/01714* (2013.01); *H03K 19/01735* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 4,484,092 A | * | 11/1984 | Campbell, Jr. | .. H03K 19/01714 326/88 |
| 5,241,502 A | * | 8/1993 | Lee | ...... G11C 7/1057 326/88 |
| 6,756,623 B2 | | 6/2004 | Furuie et al. | |
| 8,076,966 B2 | | 12/2011 | Hosoda et al. | |

\* cited by examiner

*Primary Examiner* — Jeffery S Zweizig
(74) *Attorney, Agent, or Firm* — Ray A. King; Charles A. Brill; Frank D. Cimino

(57) ABSTRACT

Aspects of the disclosure provide for a circuit. In some examples, the circuit includes a first transistor, a second transistor, a third transistor, a first capacitor, and a second capacitor. The first transistor comprises a drain terminal coupled to an input voltage node, a source terminal coupled to a first node, and a gate terminal coupled to a second node. The second transistor comprises a drain terminal coupled to a third node, a source terminal coupled to a fourth node, and a gate terminal coupled to a fifth node. The third transistor comprises a drain terminal coupled to a sixth node, a source terminal configured to couple to a gate terminal of a switching transistor, and a gate terminal coupled to a seventh node. The first capacitor is coupled between the first node and the third node. The second capacitor is coupled between the fourth node and the sixth node.

18 Claims, 5 Drawing Sheets

MULTI-CAPACITOR BOOTSTRAP CIRCUIT

CROSS-REFERENCE TO RELATED APPLICATIONS

The present application is a continuation of U.S. Non-Provisional patent application Ser. No. 16/690,034, filed on Nov. 20, 2019, which claims priority to U.S. Provisional Patent Application No. 62/771,458, which was filed Nov. 26, 2018, is titled "COMPACT AND FAST HIGH SIDE NMOS GATE DRIVER WITH BOOTSTRAPPING SELF-TIMED ZERO VOLTAGE TURN-ON AND GATE-CHARGE RECUPERATION," and which Applications are hereby incorporated herein by reference in their entirety.

BACKGROUND

A switched mode power supply (SMPS) transfers power from an input power source to a load by switching one or more power transistors coupled through a switch node/terminal to an energy storage element (such as an inductor/transformer and/or capacitor), which is capable of coupling to the load. The power transistors can be included in a power converter that includes, or is capable of coupling to, the energy storage element. An SMPS can include an SMPS controller to provide one or more gate drive signals to the power transistor(s). It may be desirable in some circumstances to operate the SMPS with an input voltage that has a comparatively low value, creating complexities in operating the power transistors of the SMPS.

SUMMARY

At least some aspects of the present disclosure provide for a circuit. In some examples, the circuit includes a first transistor, a second transistor, a third transistor, a first capacitor, and a second capacitor. The first transistor comprises a drain terminal coupled to an input voltage node, a source terminal coupled to a first node, and a gate terminal coupled to a second node. The second transistor comprises a drain terminal coupled to a third node, a source terminal coupled to a fourth node, and a gate terminal coupled to a fifth node. The third transistor comprises a drain terminal coupled to a sixth node, a source terminal configured to couple to a gate terminal of a switching transistor, and a gate terminal coupled to a seventh node. The first capacitor is coupled between the first node and the third node. The second capacitor is coupled between the fourth node and the sixth node.

Other aspects of the present disclosure provide for a circuit. In at least some examples, the circuit includes a bootstrap circuit and a control circuit coupled to the bootstrap circuit. The bootstrap circuit is configured to precharge a gate terminal of a switching transistor based on a first bootstrap capacitor and bootstrap the gate terminal of the switching transistor with a plurality of bootstrap capacitors, including the first bootstrap capacitor, based on a value of an input voltage of the circuit. The control circuit is configured to generate, according to an arrangement of components of a hardware structure of the control circuit, control signals for controlling the bootstrap circuit to bootstrap the gate terminal of the switching transistor with the plurality of bootstrap capacitors based on a value of a signal present at the gate terminal of the switching transistor and on the input voltage of the circuit.

Other aspects of the present disclosure provide for a system. In at least some examples, the system includes a power converter, a bootstrap circuit coupled to the power converter, and a control circuit coupled to the bootstrap circuit and the power converter. The power converter comprises a high-side switching transistor coupled between an input voltage node and a switching node and a low-side switching transistor coupled between the switching node and a ground node. The bootstrap circuit is configured to pre-charge a gate terminal of the high-side switching transistor with a first bootstrap capacitor bootstrap the gate terminal of the high-side switching transistor with a plurality of bootstrap capacitors based on a value of an input voltage of the system. The control circuit is configured to generate control signals for controlling the bootstrap circuit to bootstrap the gate terminal of the high-side switching transistor with the plurality of bootstrap capacitors based on a value of a signal present at the gate terminal of the high-side switching transistor and on the input voltage of the system.

BRIEF DESCRIPTION OF THE DRAWINGS

For a detailed description of various examples, reference will now be made to the accompanying drawings in which.

DETAILED DESCRIPTION

Figure 1:
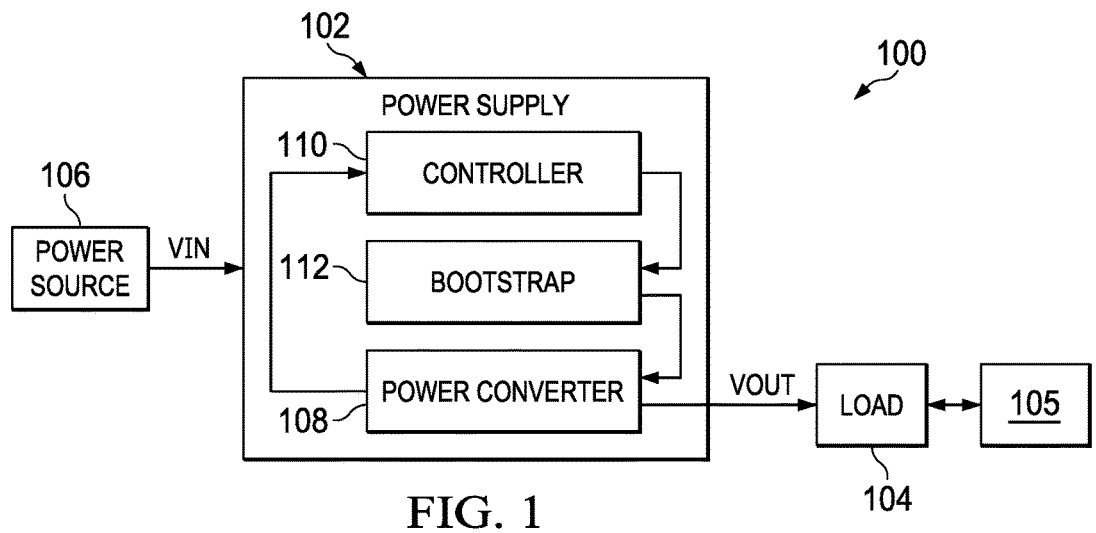
FIG. 1 shows a block diagram of an illustrative power delivery system in accordance with various examples.

In at least some system implementations, it may be desirable to provide for continued operation when an input voltage (VIN) of the system falls to low levels or values. For example, it may be desirable for the system to continue operating when VIN falls to about 1.8 volts (V), about 1.6V, or less. For example, market interest may exist for low-power direct-current (DC) to DC power converters that support low supply voltages (such as less than about 2.7V). The desired minimum operating supply voltage may further decrease, in some implementations, to as low as 1.6V (e.g., a voltage of two series coupled, discharged, alkaline cells). At the same time, market interest also exists for high conversion efficiencies at the low supply voltages. Thus, a combination of high performance and low supply voltage in one device may be of market interest.

One way to achieve such operation in a power converter is to utilize a p-type field effect transistor (FET) (pFET) as a high-side transistor (HSFET) of the power converter. Utilizing the pFET as the HSFET enables the power converter to pass VIN to a switch (SW) node by pulling a gate terminal of the pFET low. The gate terminal of the pFET may be pulled low, in one example, by coupling the gate terminal to a ground node held at a ground potential. However, for various reasons it may be desirable to utilize an n-type FET (nFET) as the HSFET. For example, a specific resistance of the pFET may be greater than that of the nFET, resulting in a larger physical size of the pFET. Additionally, at least some implementations of the pFET may require a larger duty cycle for approximately equivalent operation to the nFET. The pFET may further be less efficient in power transfer (e.g., have greater switching and/or heat losses) between a power source supplying VIN and the SW node than the nFET when operating under substantially the same conditions.

However, to implement the nFET as the HSFET of the power converter, a gate terminal of the nFET must be held at a potential that exceeds a gate-to-source voltage threshold (VTH) of the nFET. This means that when the nFET is conductive such that a source terminal of the nFET is at a potential of approximately VIN, the gate terminal of the nFET must be at a potential of approximately VIN plus at least VTH to continue operating the nFET in a conductive state. Therefore, to provide the potential at the gate terminal of the nFET, the nFET is bootstrapped. Bootstrapping the nFET includes coupling a capacitor to the gate terminal of the nFET. When the HSFET is not conductive, such as when a low-side FET (LSFET) of the power converter is conductive, the capacitor is charged. When the HSFET is to again become conductive, a bottom plate of the capacitor is coupled to the power source and the capacitor is discharged to the gate terminal of the HSFET. In this way, the capacitor operates as a doubling charge pump. In this configuration, the potential seen at the gate terminal of the HSFET is approximately equal to 1.7*VIN (e.g., about 2*VIN minus some losses associated with a discharging capacitor and/or conduction losses in a critical path between the discharging capacitor and the gate terminal of the HSFET) and the HSFET remains conductive, despite the low value of VIN, as long as VIN remains greater than VTH.

The bootstrapping, or implementation of a doubling charge pump, in at least some examples includes its own disadvantages. For example, the bootstrap capacitor may be comparatively large in size, consuming a large surface area of a silicon die or circuit board and thus having a high relative cost. The bootstrap capacitor further may be initiated at a time when a potential present at the gate terminal of the HSFET begins to rise. This may be before an inductive breakdown of VIN, causing at least some charge of the bootstrap capacitor to be lost, leading to a need for a capacitor having an even larger capacitance (and therefore larger physical size) to compensate for the amount of charge lost. Furthermore, the HSFET may not be pushed into a linear region of operation (e.g., linear mode) by the bootstrap capacitor, causing the HSFET to incur comparatively large power losses during turn-on of the HSFET.

At least some aspects of the present disclosure provide for a dual-capacitor bootstrap circuit. In some examples, the dual-capacitor bootstrap circuit is referred to as a tripling charge pump. The dual-capacitor bootstrap circuit includes two capacitors coupled in series via switches. In this way, during turn-on of the HSFET, only one of the bootstrap capacitors may be discharged to the gate terminal of the HSFET. After a potential at the gate terminal reaches a threshold amount, the second bootstrap capacitor may be discharged to the gate terminal of the HSFET. In this way, when the first bootstrap capacitor is discharged to the gate terminal of the HSFET, a potential of approximately 0.7*VIN is present at the gate terminal of the HSFET. When the second bootstrap capacitor is also discharged to the gate terminal of the HSFET in series with the first bootstrap capacitor, and a bottom plate of the second bootstrap capacitor is pulled up to VIN, a potential of approximately 2.1*VIN (e.g., about 3*VIN minus some losses associated with discharging capacitor(s) and/or conduction losses in a critical path including the discharging capacitor(s) and the gate terminal of the HSFET) is present at the gate terminal of the HSFET.

In at least some implementations, coupling of the second bootstrap capacitor to discharge in series with the first bootstrap capacitor is auto-selecting. For example, a control circuit monitors the potential present at the gate terminal of the HSFET and a control signal for coupling the second bootstrap capacitor to discharge in series with the first bootstrap capacitor is generated based on that monitoring. In other examples, a control signal for coupling the second bootstrap capacitor to discharge in series with the first bootstrap capacitor is received from a controller (e.g., such as a processor) that generates the control signal without using the control circuit.

Various implementations of the dual-capacitor bootstrap circuit may have benefits over the single capacitor bootstrap circuit discussed above. For example, by generating a bootstrap capacitance through two individual and series-coupled bootstrap capacitors, a surface area that is consumed may be reduced. Additionally, for a desired bootstrapping figure of merit, the dual-capacitor bootstrap circuit may have less overall capacitance for the same performance than the single capacitor bootstrap circuit. The bootstrapping figure of merit is a ratio of a final gate-to-source voltage of the HSFET to an initial voltage across one bootstrap cap of the dual-capacitor bootstrap circuit. For example, in an implementation in which a single capacitor bootstrap circuit is used, the single bootstrap capacitor may have a capacitance of about 1000 picofarads (pF) to provide a particular bootstrapping figure of merit. For the same desired bootstrapping figure of merit, the dual-capacitor bootstrap circuit may have two separate bootstrap capacitors that together total a capacitance of about 630 pF, or approximately 40% of the single bootstrap capacitor. This reduction in required capacitance for the desired bootstrapping figure of merit results in reduced physical size of a bootstrap circuit and reduced cost of manufacturing. For example, for a substantially same bootstrapping performance, the single capacitor bootstrap circuit may have a ratio of capacitor surface area to a surface area consumed by the HSFET of about 1.97. In contrast, the dual-capacitor bootstrap circuit may have a ratio of capacitor surface area to a surface area consumed by the HSFET of about 0.97.

In at least some examples, a charging circuit is coupled to the dual-capacitor bootstrap circuit. The charging circuit, in at least some examples, recovers a portion of a charge present at the gate terminal of the HSFET and partially charges one, or both, of the bootstrap capacitors based on this charge. A remaining charge of the bootstrap capacitors until the bootstrap capacitors are each fully recharged may be provided by the power source. In this way, a minimum off-time of the power converter may be reduced by requiring less time for recharging the bootstrap capacitors from the power source. Moreover, power efficiency is increased by recovering charge from the gate terminal of the HSFET.

Turning now to FIG. 1, a block diagram of an illustrative power delivery system 100 is shown. In various examples, the system 100 is representative of an electronic device that receives power via a switched mode power supply (SMPS) from a power source such as a battery. In other examples, the power source is an antenna or other circuit that receives power from another device (not shown) via radio waves, electromagnetic waves, etc. Certain implementations of the system 100 may be particularly benefitted by the teachings of the present disclosure. For example, wearable devices may have limited space available for consumption, thus limiting runtime of the wearable device. Additionally, in some examples in which a power source is non-rechargeable, it may be desirable to maximize use of the non-rechargeable power source prior to its depletion. Furthermore, as a general proposition it may be desirable to enable a wearable device to continue operating for an extended period of time before requiring recharging of a battery for continued use. In each of these examples, the present disclosure may provide particular benefits as discussed briefly above and in greater detail below.

In at least some implementations, the system 100 is representative of a wearable audio device. The wearable audio device may be a hearing aid, headphones, earphones, or other wearable devices that interact with a wearer's ears. The wearable audio device may be powered via a rechargeable power source or via a non-rechargeable power source. In other implementations, the system 100 is representative of a wearable optical device. The wearable optical device may be glasses, a lens (e.g., such as, or similar to, a contact lens), or other wearable devices that interact with a wearer's eyes. The wearable optical device may be powered via a rechargeable power source or via a non-rechargeable power source. In other implementations, the system 100 is representative of a wearable device capable of being worn on a limb such as a wearer's arm, wrist, finger(s), leg, ankle, etc. Such a device may be an activity tracker, a location tracker, a smart watch, a button or other trigger for a notification system, a sensor, or any other suitable device that may be worn by a wearer and powered via a rechargeable power source or via a non-rechargeable power source. Other examples of implementations of the system 100 as a wearable device may include a wearable camera, a wearable microphone, a wearable and/or implantable medical device, etc.

Implementations of the system 100 are not limited to only wearable devices. In various other implementations, the system 100 is representative of a smartphone, a display device, a laptop computer, a tablet device, a tool, a device related to automobiles or other forms of transportation, a consumer, prosumer, or professional electronic device, etc. Generally, the system 100 is representative of any system that receives power from a power source that depletes with use (e.g., a battery, whether rechargeable or not, a supercapacitor, etc.) and for which it may be desirable to enable the system 100 to continue operating as a voltage of that power source decreases in value.

In at least one example, the system 100 includes a power supply 102 coupled to a load 104. The load 104 may in turn couple to one or more peripheral devices, such as input and/or output devices 105. For example, at least some of the input and/or output devices 105 may perform functions ascribable to one or more of the wearable devices described above. In various examples, the input and/or output devices 105 may include a speaker, a microphone, a display, a user input device, a sensor, a camera, a light-emitting element, a transmitter, a receiver, or any other suitable component that facilitates use of the system 100 as a wearable device. The power supply 102 is configured to provide an output voltage (VOUT) to the load 104 that is in some way determined according to an input voltage (VIN) received from a power source 106. Accordingly, the power supply 102 is configured to couple to the power source 106. In at least one example, the power supply 102 is a SMPS that switches power from the power source 106 to the load 104. The power supply 102, in at least some examples, includes a power converter 108, a controller 110, and a bootstrap circuit 112. In various other examples, the power supply 102 includes additional components, such as a feedback circuit (not shown), a driver (not shown), and/or other circuits or components that provide input for controlling the power converter 108 to switch power from the power source 106 to the load 104. The power converter 108 is configured to regulate delivery of power from the power source 106, which provides VIN, to the load 104 as VOUT. Additionally, in some examples the load 104 is a rechargeable battery, while in other examples the load 104 is one or more components, circuits, sub-systems, etc. which may or may not also include a rechargeable battery.

The controller 110, in at least some examples, exerts direct or indirect control over the power converter 108. For example, the controller 110 monitors one or more characteristics associated with the power converter 108 and based on a value of those monitored characteristics with respect to threshold or reference values, controls the power converter 108. One example of this monitoring is the controller 110 monitoring a feedback signal generated by scaling VOUT and comparing the feedback signal to a reference signal. When the feedback signal has a value greater than the value of the reference signal, the controller 110 takes a first action. When the feedback signal has a value less than the value of the reference signal, the controller 110 takes a second action. The first action could be controlling a HSFET (not shown) of the power converter 108 to turn off and the second action could be controlling a LSFET (not shown) of the power converter 108 to turn on, or vice versa. In at least some implementations, the controller 110 makes determinations for controlling the power converter 108 based on one or more comparisons, one or more logical operations or other data processing functions, a value of a clock signal, or any other suitable method for generating control signals for controlling a power converter. Based on one or more control signals generated by the controller 110, the bootstrap circuit 112 controls operation of an HSFET of the power converter 108. In at least some examples, one or more other drivers may receive other control signals generated by the controller 110 for controlling other transistors (not shown) of the power converter 108.

In at least some examples, the bootstrap circuit 112 functions as a driver for the HSFET of the power converter 108. For example, based on a control signal received from the controller 110, the bootstrap circuit 112 controls a value of a gate control signal generated and provided to a gate terminal of the HSFET. The value of the gate control signal at least partially controls operation of the HSFET. In this way, the bootstrap circuit 112 may be said to drive the HSFET. When the control signal received from the controller 110 has a logical high value, the bootstrap circuit 112 generates the gate control signal to cause the HSFET to turn on and become conductive. When the control signal received from the controller 110 has a logical low value, or other than a logical high value, the bootstrap circuit 112 generates the gate control signal to cause the HSFET to turn off and become non-conductive.

In at least some examples, the bootstrap circuit 112 generates the gate control signal in a multi-stage approach. For example, when the control signal received from the controller 110 transitions from a logical low value to a logical high value, the bootstrap circuit 112 may generate the gate control signal to pre-charge the gate terminal of the HSFET. The bootstrap circuit 112 performs the pre-charging by coupling a previously charged first bootstrap capacitor (not shown) to the gate terminal of the HSFET. Energy may discharge from the first bootstrap capacitor to charge a parasitic gate terminal capacitance of the HSFET and increase a voltage potential present at the gate terminal of the HSFET. When the voltage potential at the gate terminal of the HSFET reaches a predefined level, in at least some examples, the bootstrap circuit 112 automatically controls a previously charged second bootstrap capacitor (not shown) to couple in series with the first bootstrap capacitor. In this way, a path is formed from the power source 108 to a bottom plate of the second bootstrap capacitor, from a top plate of the second bootstrap capacitor to a bottom plate of the first bootstrap capacitor, and from a top plate of the first bootstrap capacitor to the gate terminal of the HSFET. This coupling increases the potential present at the gate terminal of the HSFET to approximately 2.1*VIN, enabling use of an nFET as the HSFET, as discussed previously herein. When the HSFET is turned off, in at least some examples one, or both, of the first bootstrap capacitor and the second bootstrap capacitor are at least partially recharged by energy stored by the gate terminal capacitance of the HSFET.

Figure 2:
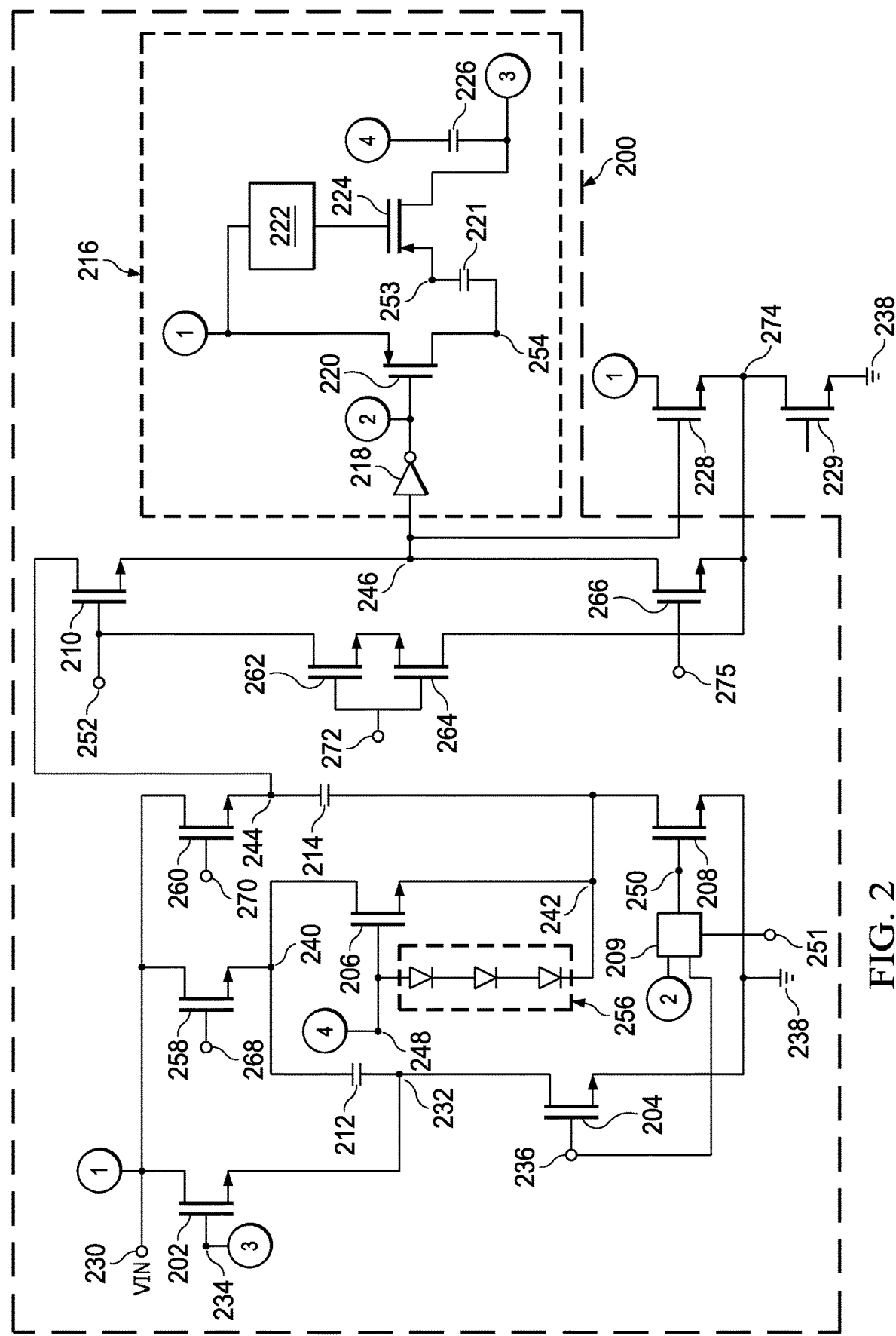
FIG. 2 shows a schematic diagram of an illustrative bootstrap circuit in accordance with various examples.

Turning now to FIG. 2, a schematic diagram of an illustrative bootstrap circuit 200 is shown. In at least some examples, the circuit 200 is suitable for implementation as the bootstrap circuit 112 of the system 100 of FIG. 1. In at least some examples, the circuit 200 includes a transistor 202, a transistor 204, a transistor 206, a transistor 208, a transistor 210, a capacitor 212, a capacitor 214, and a control circuit 216. The control circuit 216, in some examples, includes an inverter circuit 218, a transistor 220, a capacitor 221, a filter 222, a transistor 224, and a capacitor 226.

In at least one implementation of an architecture of the circuit 200, the circuit 200 is configured to couple to a gate terminal of a HSFET 228 of a power converter, such as the power converter 108 of the system 100 of FIG. 1. Via this coupling, the circuit 200 provides a gate control signal to the gate terminal of the HSFET 228. The transistor 202 has a drain terminal coupled to a node 230, a source terminal coupled to a node 232, and a gate terminal coupled to a node 234. The circuit 200 is configured to couple to a power source, such as the power source 106 of system 100, to receive VIN at the node 230. The transistor 204 has a drain terminal coupled to the node 232, a source terminal coupled to a ground node 238, and a gate terminal coupled to a node 236. The transistor 206 has a drain terminal coupled to a node 240, a source terminal coupled to a node 242, and a gate terminal coupled to the node 248. The transistor 208 has a drain terminal coupled to the node 242, a source terminal coupled to the ground node 238, and a gate terminal coupled to a node 250. The signal selection circuit 209 has a first input terminal coupled to the node 236, a second input terminal, a third input terminal coupled to a node 251, and an output terminal coupled to the node 250. The transistor 210 has a drain terminal coupled to a node 244, a source terminal coupled to a node 246, and a gate terminal coupled to a node 252. In at least some examples, the node 251 is configured to receive a signal selection control signal from a controller, such as the controller 110 of the system 100. In at least some examples, the signal selection control signal controls whether the transistor 208 is controlled, at least partially, according to a signal output by the inverter circuit 218. Although not shown, in other examples of the circuit 200, the signal selection circuit 209 is omitted and the node 250 is coupled to the output terminal of the inverter circuit 218.

The circuit 200 is configured to couple to the gate terminal of the HSFET 228 at the node 246 to provide a gate control signal to the HSFET 228. A state of the HSFET 228 (e.g., either conductive or non-conductive) is at least partially determined by a potential present at the node 246. The circuit 200 is further configured to receive a control signal at the node 252 for controlling the HSFET 228. In at least some examples, the control signal is generated by a controller, such as the controller 110 of the system 100 of FIG. 1, such that the circuit 200 is configured to couple at the node 252 to an output terminal of the controller. The capacitor 212 is coupled between the node 232 and the node 240. The capacitor 214 is coupled between the node 242 and the node 244. The inverter circuit 218 has an input terminal coupled to the node 246, and an output terminal coupled to the second input terminal of the signal selection circuit 209. The transistor 220 has a gate terminal coupled to the output terminal of the inverter circuit 218, a drain terminal coupled to a node 254 and a source terminal coupled to the node 230. The filter 222 has an input terminal coupled to the node 230 and an output terminal coupled to a gate terminal of the transistor 224. The transistor 224 further has a drain terminal coupled to the node 234 and a source terminal coupled to a node 253. The capacitor 221 is coupled between the node 253 and the node 254. The capacitor 226 is coupled between the node 234 and a node 248. In some examples, a transistor or other switch (not shown) is coupled between the bottom plate of the capacitor 226 and the node 234, for example, to enable the bottom plate of the capacitor 226 to be selectively de-coupled from the node 234. Further, in some examples a transistor or other switching device (not shown) is coupled between the top plate of the capacitor 226 and the node 248, for example, to enable the top plate of the capacitor 226 to be selectively de-coupled from the node 248.

In some examples, the circuit 200 further includes a LSFET 229, diode stack 256, a transistor 258, a transistor 260, a transistor 262, a transistor 264, and a transistor 266. The LSFET 229 has a drain terminal coupled to a SW node 274 (which may also be coupled to a source terminal of the HSFET 228), a source terminal coupled to the ground node 238, and a gate terminal. The diode stack 256 includes one or more diodes coupled in series between the node 248 and the node 242. The transistor 258 has a drain terminal coupled to the node 230, a source terminal coupled to the node 240, and a gate terminal coupled to a node 268. The transistor 260 has a drain terminal coupled to the node 230, a source terminal coupled to the node 244, and a gate terminal coupled to a node 270. The transistor 262 has a drain terminal coupled to the node 252, a source terminal, and a gate terminal coupled to a node 272. The transistor 264 has a drain terminal coupled to the node 274, a source terminal coupled to the source terminal of the transistor 262, and a gate terminal coupled to the node 272. The transistor 266 has a drain terminal coupled to the node 246, a source terminal coupled to the node 274, and a gate terminal coupled to a node 275. In at least some examples, control signals received at the node 236, node 268, node 270, node 252, node 272, and/or node 275 are received from a controller, such as the controller 110 of the system 100, to control at least some operation of the circuit 200. Other control signals in the circuit 200 may be generated by various components of the circuit 200, as discussed in greater detail elsewhere herein.

In an example of operation of the circuit 200, the gate control signal is generated at the node 246 based on a control signal received at the node 252. When the LSFET 229 of the power converter turns off, a potential at the node 274 has a value of $-V_{BE}$ and a backgate diode (not shown) of the LSFET 229 starts conducting the load current. For example, when a potential at the drain terminal of the LSFET 229 becomes negative, but potentials at the gate and source terminals of the LSFET 229 are approximately 0V, the LSFET 229 approximates an n-type bi-polar junction (NPN) transistor because of a forward biased body diode of the LSFET 229. This NPN transistor has a base-emitter, or forward, voltage of VBE, causing the potential at the node 274 to have the value of −VBE. In at least some examples, at this time the first HSFET charging phase is initiated and the gate terminal of the HSFET 228 is charged. The gate terminal of the HSFET 228 may be charged from only the capacitor 214 during the first HSFET charging phase. For example, based on the control signal received at the node 252 from the controller, the transistor 204, transistor 208 and the transistor 210 each turn on, becoming conductive. The transistor 202 and transistor 206 remain turned off, or non-conductive. The transistor 208 holds the bottom plate of the capacitor 214 at a level present at the ground node 238. To turn on the transistor 210, its gate voltage is pulled to approximately 1.7*VIN minus one diode voltage, creating a charging path that includes the transistor 210, the capacitor 214, and the transistor 208. The effective bootstrap capacitance (charging capacitance) in this charging path is the capacitance of the capacitor 214.

Since the potential at the node 274 is at $-V_{BE}$, the VIN potential at the top plate of the capacitor 214 is sufficient in value to charge the gate capacitance of the HSFET 228 to approximately 0.7*VIN, which is sufficient to turn on the HSFET 228. As the HSFET 228 is turned on, the potential at the node 230 will be discharged from the level of VIN to the level of the node 274 (e.g., $-V_{BE}$), resulting in 0V drain-to-source voltage ($V_{DS}$) of the HSFET 228. For example, drain voltage equals source voltage equals $-V_{BE}$. A high-side parasitic inductance between the power source and the node 230 conducts no current at this time and the HSFET 228 is turned on and operating in the linear region of operation. Since the node 230 is now at a level of $-V_{BE}$, the voltage across the high-side parasitic inductance at the node 230 is VIN+$V_{BE}$, which is, in some examples, a maximally achievable voltage across the high-side parasitic inductance and may yield a shortest possible commutation time of the HSFET 228. Current begins to build up across the high-side parasitic inductance, in some examples, with the fastest achievable rate when the HSFET 228 has a shortest possible commutation time. This minimizes an amount of time that the LSFET 229 backgate diode is conducting and thereby increases efficiency of the power converter. As current builds up in the high-side parasitic inductance, the current starts flowing through the HSFET 228 and the HSFET 228 undergoes commutation. As the HSFET 228 was previously turned on and 0V $V_{DS}$ was achieved, approximately no switching losses (e.g., power equal to $V_{DS}$ times drain current) occur during commutation. This results in further increased efficiency of the power converter through a reduction in power lost to heat dissipation through switching losses.

Turn on of a second HSFET charging phase of the HSFET 228, in at least some examples, is self-timed. To provide this functionality, the circuit 200, or a system implementing the circuit 200, may have two internal supply voltages. In at least some examples, the first internal supply voltage is VIN. In other examples, the first internal supply voltage is referred to as $VIN_{POSFILT}$ and has only a positive deglitch, such that only positive spikes in VIN are filtered. $VIN_{POSFILT}$ may be generated, in some examples, by filtering VIN to generate $VIN_{POSFILT}$. The second internal supply voltage (referred to hereafter as $VIN_{FULLFILT}$) additionally has a negative deglitch so that both positive and negative spikes in VIN are filtered. The deglitching or filtering of VIN is performed, in some examples, by the filter 222. Although not shown, in at least some examples the input terminal of the inverter circuit 218 is coupled to the node 246 via a source follower circuit to protect the inverter circuit 218 from possible over-voltage or other damage. The inverter circuit 218 is driven by $VIN_{FULLFILT}$. As the HSFET 228 is charged to approximately 0.7*VIN in the first HSFET charging phase, the inverter circuit 218 detects a logic level high at the node 246 and pulls its output down to a logic level low. Otherwise, when a logic level low is present at the node 246, the inverter circuit 218 drives its output up to a logic level high. The output of the inverter circuit 218 drives the transistor 208 and the transistor 220. As the gate terminal of the HSFET is charged from the capacitor 214 during the first HSFET charging phase, the gate terminal of the transistor 220 is pulled to ground by the output of the inverter circuit 218. Because the source terminal of the transistor 220 is at VIN potential, which is approximately equal to $-V_{BE}$ during the first HSFET charging phase, the transistor 220 remains turned off.

When the current in the high-side parasitic inductance is completely built up, VIN recovers. The recovery of VIN causes a gate to source voltage of the transistor 220 to be sufficient to turn on the transistor 220. When the transistor 220 turns on, a bottom plate of the capacitor 221 is electrically coupled to the node 230 and a top plate of the capacitor 221 is at a value of approximately 1.7*VIN (e.g., assuming that the capacitor 221 was previously charged to a value of VIN). In at least some examples, the capacitor 221 and the capacitor 226 are each coupled to the node 230 through a transistor (not shown) to enable charging of the capacitor 221 and the capacitor 226. The charging is performed, in at least some examples, based on the receipt of controls signals from the controller 110 of the system 100. The gate terminal of the transistor 224 receives $VIN_{FULLFILT}$ from the filter 222, which remains approximately equal to a direct-current (DC) level of VIN when VIN breaks down. Therefore, when the top plate of capacitor 221 is at approximately 1.7*VIN, the transistor 224 is turned on and the bottom plate of the capacitor 226 is electrically coupled to the top plate of the capacitor 214. This causes a voltage present at the bottom plate of the capacitor 226 to be approximately equal to 1.7*VIN (e.g., in some examples, approximately 1.7*VIN minus a voltage drop of the transistor 224), thus resulting in a value of approximately 2.4*VIN being present at the top plate of the capacitor 226. This again assumes that the capacitor 226 was previously charged to a value of VIN.

As described above, when the gate terminal of the transistor 220 was pulled to a logic level low, so was the gate terminal of the transistor 208, which turned off the transistor 208. As VIN recovers, the control circuit 216 is automatically activated through the transistor 220. Activation of the control circuit 216 initiates the second HSFET charging phase. In at least some examples, initiation of the second HSFET charging phase is performed without the use of timers or additional timing circuitry other than the control circuit 216 that performs the initiation based on the value of VIN. The control circuit 216 initiates the second HSFET charging phase by controlling the transistor 208 to turn off, the transistor 202 to turn on, and the transistor 206 to turn on. In at least some implementations, upon initiation of the second HSFET charging phase, the gate terminal of the transistor 210 is further charged to approximately a value of 2.4*VIN to maintain a sufficient gate to source voltage of the transistor 210 when the HSFET 228 is bootstrapped during the second HSFET charging phase. In some examples, the node 248 and the node 252 are coupled together to maintain the sufficient gate to source voltage of the transistor 210 when the HSFET 228 is bootstrapped during the second HSFET charging phase. In other examples, a circuit (not shown), such as another instance of the circuit 216 or any other suitable charge pump or voltage increasing circuit, is implemented to generate the voltage at the node 252 having the value of approximately 2.4*VIN.

When the second HSFET charging phase is initiated, the transistor 202 couples the bottom plate of the capacitor 212 to the node 230. The gate terminal of the transistor 202 is held at a potential of approximately 1.7*VIN by the control circuit 216. Further, the transistor 206 couples the top plate of the capacitor 212 to the bottom plate of the capacitor 214. Initially, the gate terminal of the transistor 206 is held at a potential of approximately 2.4*VIN by the control circuit 216 because the top plate of the capacitor 214 will have a potential of approximately 2.1*VIN. In at least some implementations, the capacitor 212 and the capacitor 214 are sized (e.g., have capacitances selected) such that charge present at the top plate of the capacitor 214 is limited to about 2.1*VIN. In other implementations, the capacitor 212 and the capacitor 214 are sized such that charge present at the top plate of the capacitor 214 is limited to any other suitable and desired value. In some examples, the diode stack 256 protects the gate terminal of the transistor 206 from damage as the potential of the top plate of the capacitor 212 and the bottom plate of the capacitor 214 decline as charge is transferred to the gate capacitance of the HSFET 228. The transistor 210 couples the top plate of the capacitor 214 with the gate terminal of the HSFET 228. While in this configuration, the capacitor 212 and the capacitor 214 are coupled in series between the node 230 and the gate terminal of the HSFET 228. A full charging path of the gate terminal of the HSFET 228, in some implementations, comprises the transistor 202, the capacitor 212, the transistor 206, the capacitor 214, and the transistor 210. In other implementations, the full charging path of the gate terminal of the HSFET 228 (e.g., a critical path for charging the gate terminal of the HSFET 228) consists of, or consists essentially of, the transistor 202, the capacitor 212, the transistor 206, the capacitor 214, and the transistor 210.

An effective bootstrap capacitance (e.g., a charging capacitance) in the second HSFET charging phase is approximately equal to one-fourth of a sum of capacitances of the capacitor 212 and the capacitor 214. At an end of the second HSFET charging phase, when the capacitor 212 and the capacitor 214 are coupled in series between the node 230 and the gate terminal of the HSFET 228, the gate terminal of the HSFET 228 is charged to its final value. For example, when the gate terminal of the HSFET 228 is charged to its final value, a gate-to-source capacitance (e.g. gate capacitance) of the HSFET 228 is fully charged and a turn-on sequence of the HSFET 228 is complete. Additionally, as described above, in at least some examples, the capacitor 214 is reused in the second HSFET charging phase to bootstrap the HSFET 228 after being discharged in the first HSFET charging phase to precharge the HSFET 228. Accordingly, as VIN recovers after the capacitor 214 has discharged to precharge the HSFET 228, the capacitor 214 at least partially recharges via a backgate diode (not shown) of the transistor 260.

While in the first HSFET charging phase, bootstrapping does not occur. For example, because the bottom plate of the capacitor 214 is coupled to the ground node 238 through the transistor 208, the capacitor 214 discharges to charge the gate terminal of the HSFET 228. However, because the bottom plate of the capacitor 214 is not coupled to a voltage source that lifts a potential present at the bottom plate of the capacitor 214, the capacitor 214 alone does not bootstrap the HSFET 228. By preventing bootstrapping of the HSFET 228 until after commutation of the HSFET 228 is completed, the circuit 200 is improved when compared to circuits that do not precharge the gate terminal of the HSFET 228. For example, for circuits that bootstrap the gate terminal of the HSFET 228 without precharging, a portion of charge of bootstrap capacitors is lost. By precharging the gate terminal of the HSFET 228 prior to bootstrapping the gate terminal of the HSFET 228, charge loss of the bootstrap capacitors is minimized. By reducing charge loss of the bootstrap capacitors, bootstrap capacitors having a smaller capacitance, and therefore smaller physical size, may be used, improving the circuit 200 when compared to circuits that do not precharge the gate terminal of the HSFET 228.

As discussed above, by controlling a sequence in which components of the circuit 200 are turned off and/or charged, at least some charge stored in a gate capacitance of the HSFET 228 is returned to the capacitor 212 and/or the capacitor 214 without the use of additional circuitry. By at least partially recharging the capacitor 212 and/or the capacitor 214 based on charge stored by the gate capacitance of the HSFET 228, a time for recharging the capacitor 212 and/or the capacitor 214 from a power source coupled to the node 230 is reduced. By reducing the recharge time of the capacitor 212 and/or the capacitor 214 from the node 230, the circuit 200 may control the HSFET 228 to operate at a higher duty cycle.

In at least one example of the turn off sequence, the node 234 is pulled down to approximately zero volts (e.g. a ground level) to turn off the transistor 202. Next, the node 272 is pushed high to a value of approximately 1.7*VIN to cause the transistor 262 and the transistor 264 to become conductive and discharge the node 252 to the node 274, turning off the transistor 210. The transistor 204 is then turned on by pushing the node 236 high to a value of approximately VIN. After the transistor 204 is turned on, the bottom plate of the capacitor 212 is coupled to ground, creating a path from the node 246 through a backgate diode (not shown) of the transistor 210, the capacitor 214, the transistor 206, the capacitor 212, and the transistor 204 to the ground node 238. Current flows out of the node 246 (e.g. from the gate capacitance of the HSFET 228) through this path, at least partially recharging the capacitor 212 and/or the capacitor 214. Subsequently, the node 248 is pulled down to approximately zero volts to turn off the transistor 206. The node second input terminal of the signal selection circuit 209 is pushed high by the control circuit 216 (e.g., by way of the node 246 having a value less than a decision threshold of the inverter circuit 218) to turn on the transistor 208.

When the transistor 208 turns on, the bottom plate of the capacitor 214 is coupled to the ground node 238. This further discharges the gate capacitance of the HSFET 228 through the backgate diode of the transistor 210 by keeping the backgate diode forward biased. The backgate diode of the transistor 210 remains forward biased until a signal present at the node 246 is greater in value than a sum of a voltage present at the node 244 and a threshold voltage of the transistor 210. The current flowing through the backgate diode of the transistor 210 to the capacitor 214 further recharges the capacitor 214. Next, the node 275 is pushed high to a value of approximately 1.7*VIN to discharge any remaining charge present at the node 246. To provide maximum efficiency and not waste charge in the circuit 200, in at least one example the node 246 is discharged to the node 274. Finally, the node 268 and the node 270 are each pushed high (e.g., to approximately 1.7*VIN) to cause the transistor 258 and the transistor 260, respectively, to turn on and finish recharging of the capacitor 212 and the capacitor 214. The capacitor 212 and the capacitor 214 are each recharged until their respective voltages are each approximately equal to VIN.

In some examples, at the beginning of the first HSFET charging phase, the node 268 and the node 270 are shorted to the node 230 to turn off the transistor 258 and the transistor 260, respectively, rather than pulling the node 268 and the node 270 low to ground to turn off the transistor 258 and the transistor 260. Further, in at least some examples, the node 268 and the node 270 are shorted together to synchronize operation of the transistor 258 and the transistor 260. By shorting the node 268 and the node 270 to the node 230 to turn off the transistor 258 and the transistor 260, in at least some examples benefits are achieved for the transistor 258 and the transistor 260. For example, in the above configuration, the transistor 258 and the transistor 260 may be rated for a maximum drain-to-source voltage of about 5V. Conversely, if the node 268 and the node 270 were pulled low to approximately zero volts (e.g., coupled to the node 238), the transistor 258 and the transistor 260 may instead be required to have a larger drain-to-gate voltage (e.g., such as about 12V) to provide suitable operation. The 5V rated transistor 258 and transistor 260, in at least some examples, consume less surface area and are more efficient in operation than the 12V rated equivalent to the transistor 258 and transistor 260.

After the capacitor 212 and the capacitor 214 are each recharged, the circuit 200 may again control the HSFET 228 to turn on. In at least some examples, a turn-off sequence for components of the circuit 200 when turning off the HSFET 228 that recuperates at least some charge present at the gate terminal of the HSFET 228 increases a maximum duty cycle of the HSFET 228. For example, when the HSFET 228 and the LSFET 229 are implemented together in a power converter (not shown) or other switching environment, the turn-off sequence reduces an amount of time for recharging the capacitor 212 and the capacitor 214 while the HSFET 228 is turned off and the LSFET 229 is turned on. This reduction in charging time increases a maximum duty cycle of the HSFET 228 and therefore a device such as a power converter that implements the HSFET 228, without the addition, and requisite die area consumption and cost, of additional components for the charge recuperation.

Figure 3:
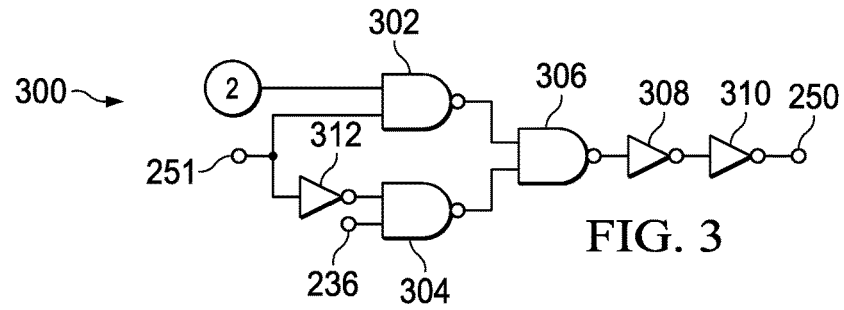
FIG. 3 shows a schematic diagram of an illustrative signal selection circuit in accordance with various examples.

Turning now to FIG. 3, a schematic diagram of an illustrative signal selection circuit 300 is shown. In at least some examples, the circuit 300 is suitable for implementation as the signal selection circuit 209 of the circuit 200 of FIG. 2. Accordingly, reference may be made to at least some elements of FIG. 2 in describing the circuit 300. In at least one implementation, the circuit 300 includes an inverting AND (NAND) logic circuit 203, a NAND logic circuit 304, a NAND logic circuit 306, an inverter circuit 308, an inverter circuit 310, and an inverter circuit 312.

In at least one example architecture of the circuit 300, the NAND logic circuit has a first input terminal coupled to the output node of the inverter circuit 218, a second input terminal coupled to the node 251, and an output terminal. The NAND logic circuit 304 has a first input terminal coupled to an output terminal of the inverter circuit 312, which has an input terminal coupled to the node 251. The NAND logic circuit further has a second input terminal coupled to the node 236 and an output terminal. The NAND logic circuit 306 has a first input terminal coupled to the output terminal of the NAN logic circuit 302, a second input terminal coupled to the output terminal of the NAND logic circuit 304, and an output terminal. The inverter circuit 208 has an input terminal coupled to the output terminal of the NAND logic circuit 306 and an output terminal coupled to an input terminal of the inverter circuit 310. The inverter circuit 310 has an output terminal coupled to the node 250. In some examples, the inverter circuit 308 and the inverter circuit 310 may be omitted as these circuits drive the node 250 to control the transistor 208. Such an omission may be made if the NAND logic circuit 306 has sufficient ability to drive the node 250 to control the transistor 208 or if an alternative component is placed in series between the output terminal of the NAND gate 306 and the node 250 to drive the node 250 to control the transistor 208.

In at least one example of operation of the circuit 300, a signal is generated at the node 250 based on a series of logical operations based on signals present at the node 236, the node 251, and the output terminal of the inverter circuit 218. For example, when the signal selection control signal received at the node 251 is asserted, or has a logical high value, the circuit 200 generates a signal at the node 250 having a value substantially equal to a signal present at the output terminal of the inverter circuit 218. When the signal selection control signal received at the node 251 is asserted, a value of the signal present at the node 236 may be irrelevant to operation of the circuit 300. When the signal selection control signal received at the node 251 is de-asserted, or a logical low value, the circuit 200 generates the signal at the node 250 having a value substantially equal to a value of the signal present at the node 236. In at least one implementation of the circuit 300, the signal selection control signal is asserted when the circuit 200 is operating in the both the first HSFET charging phase and the second HSFET charging phase and is de-asserted otherwise. When the signal selection control signal received at the node 251 is de-asserted, a value of the signal present at the output terminal of the inverter circuit 218 may be irrelevant to operation of the circuit 300. The signal present at the node 236, and its value during particular stages of operation of the circuit 200 and/or circuit 300, is discussed in greater detail elsewhere herein.

Figure 4:
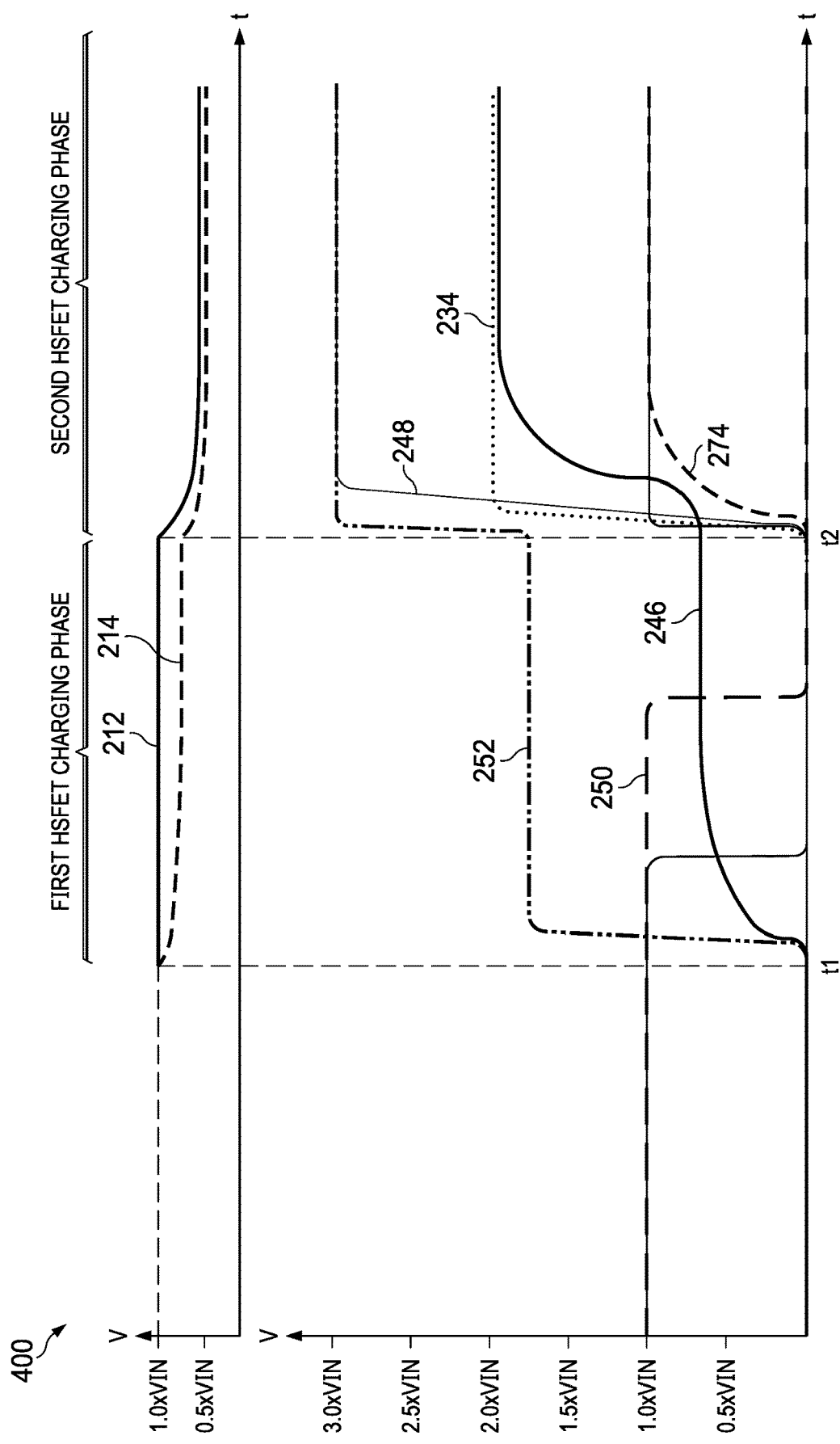
FIG. 4 shows a diagram of illustrative signals present in a bootstrap circuit in accordance with various examples.

Turning now to FIG. 4, a diagram 400 of illustrative signals present in a bootstrap circuit is shown. In at least some examples, the diagram 400 is representative of at least some signals present in the circuit 200 of FIG. 2. Accordingly, reference may be made to at least some elements of FIG. 2 in describing the diagram 400.

In at least one example, the diagram 400 illustrates operation of the circuit 200 in both the first HSFET charging phase and the second HSFET charging phase. At time t1, the first HSFET charging phase begins. As discussed above, during the first HSFET charging phase, the node 252 is charged to approximately 1.7*VIN, turning on the transistor 210. When the transistor 210 is turned on, the capacitor 214 begins to discharge to the node 246, increasing the value of a signal present at the node 246 to asymptotically approach approximately VIN minus a voltage drop of the transistor 210. As the signal present at the node 246 increases in value, VIN undergoes inductive breakdown, decreasing in value. At any time between t1 and time t2, determined at least partially based on a value of a signal present at the node 236, the node 246, and/or the node 251, the node 250 is pulled to a logic level low value, turning off the transistor 208. At t2, the second HSFET charging phase begins. In at least some examples, between the decrease in value of VIN during the first HSFET charging phase and the beginning of the second HSFET charging phase, commutation of the HSFET 228 has completed. Commutation of the HSFET 228 being completed means that the HSFET 228 is operating in a linear region of operation.

As discussed above, at a beginning of the HSFET charging phase, VIN recovers from the inductive breakdown. When VIN recovers from the inductive breakdown, the node 252 is charged to approximately 2.4*VIN to maintain the transistor 210 in a conductive state when the HSFET 228 is bootstrapped. Additionally, the node 234 is charged to approximately 1.7*VIN, turning on the transistor 202. Further, the node 248 is charged to approximately 2.4*VIN, turning on the transistor 206. In this configuration, both the capacitor 212 and the capacitor 214 discharge to the node 246, bootstrapping the HSFET 228. For example, during the second HSFET charging phase, the capacitor 212 and the capacitor 214 discharge to the node 246 to bootstrap the HSFET 228 a voltage that asymptotically approaches approximately VIN plus a voltage of the capacitor 212, plus a voltage of the capacitor 214, minus voltage drops of each of the transistor 202, transistor 206, and transistor 210. As the voltage present at the node 246 increases and VIN recovers from the inductive breakdown, the voltage present at the node 274 also increases.

Figure 5:
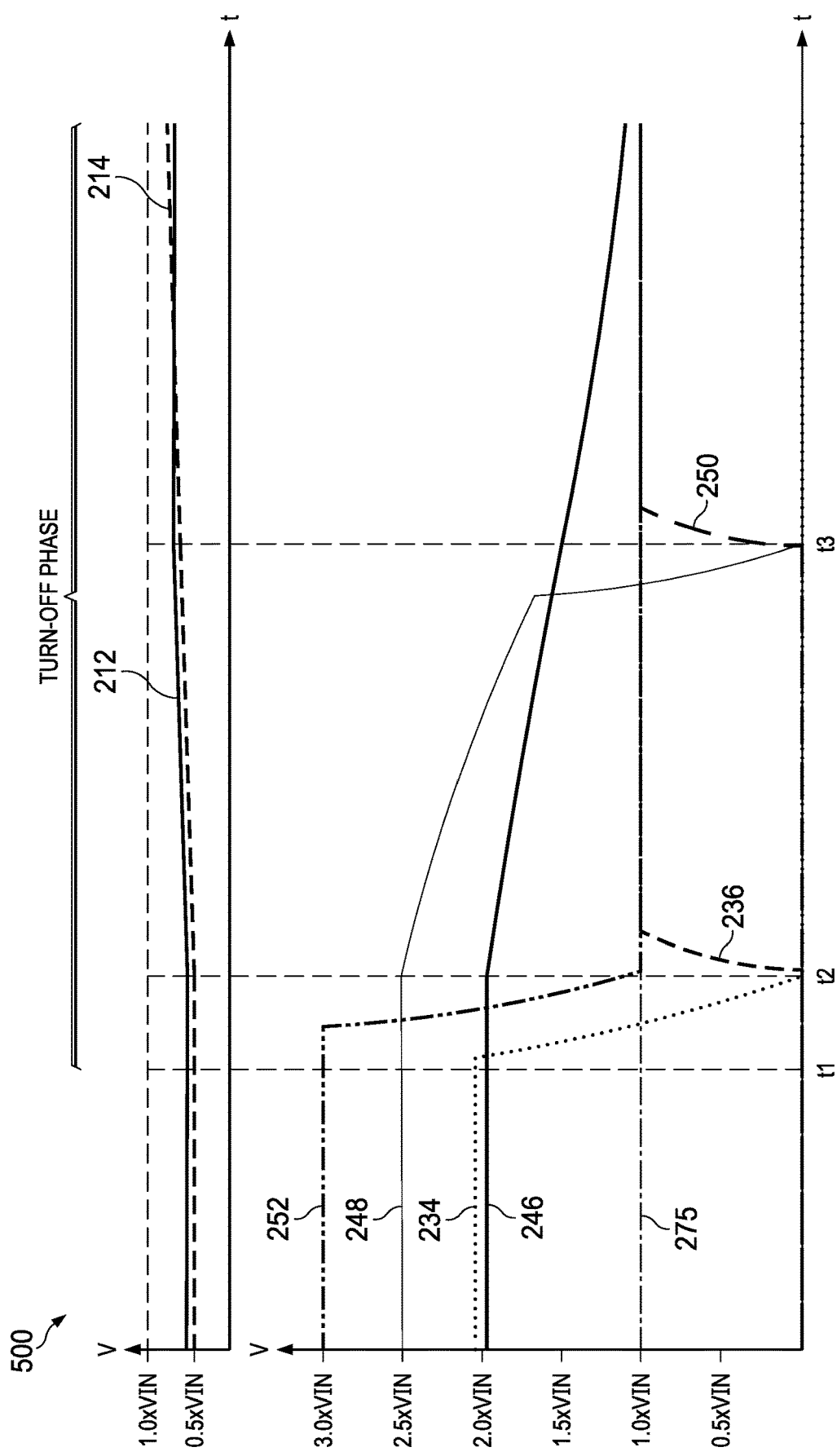
FIG. 5 shows a diagram of illustrative signals present in a bootstrap circuit in accordance with various examples.

Turning now to FIG. 5, a diagram 500 of illustrative signals present in a bootstrap circuit is shown. In at least some example, the diagram 500 is representative of at least some signals present in the circuit 200 of FIG. 2. Accordingly, reference may be made to at least some elements of FIG. 2 in describing the diagram 500.

In at least one example, the diagram 500 illustrates operation of the circuit 200 during a turn-off phase. During the turn-off phase, in at least some examples, components of the circuit 200 are controlled to change conductive states in a particular order such as to at least partially recharge the capacitor 212 and/or the capacitor 214. The partial recharging is performed, in some examples, by recuperating at least some charge present at the gate terminal of the HSFET 228 through the turn-off sequence of components of the circuit 200. Just before time t1, while the second HSFET charging phase is active, the transistor 202, transistor 206, and transistor 210 are turned on, the transistor 204, transistor 208, and transistor 266 are turned off, and the capacitor 212 and capacitor 214 are discharged. At time t1, HSFET gate discharging of the turn-off phase begins. When the HSFET gate discharging begins, the transistor 210 and the transistor 202 are each turned off and the transistor 204 is turned on. The transistor 210 turns off when the signal present at the node 252 decreases in value. The transistor 202 turns off when the signal present at the node 234 decrease in value, which occurs as at least partially as a result of the transistor 210 turning off. To turn on the transistor 204, the signal present at the node 236 is increased in value.

At time t2, the transistor 204 and the transistor 206 are each turned on, grounding the series combination of the capacitor 212 and the capacitor 214 through the transistor 204. The backgate diode of the transistor 210 conducts current from the node 246 into the series combination of the capacitor 212 and the capacitor 214. This discharges the gate capacitance of the HSFET 228 to the series combination of the capacitor 212 and the capacitor 214. After discharging the gate capacitance of the HSFET 228 to the series combination of the capacitor 212 and the capacitor 214, the transistor 206 is turned off by the decreasing value of the signal present at the node 248, at least partially caused by the transistor 210 being turned off.

At time t3, the transistor 208 is turned on by increasing the value of the signal present at the node 250. In at least some examples, the signal present at the node 250 increases in value at least partially due to the discharge of the gate capacitance of the HSFET 228. In other examples, such as during the turn-off phase of the circuit 200, the signal present at the node 250 is at least partially dependent on a value of the signal present at the node 236. The transistor 208 grounds the capacitor 214, maintaining a forward bias on the backgate diode of the transistor 210 until a potential present at the node 246 is less than a voltage present at the node 244 plus a forward bias voltage of the backgate diode of the transistor 210. At this time, as shown in the diagram 400, the capacitor 212 and the capacitor 214 are at least partially recharged when compared to a level of charge of the capacitor 212 and the capacitor 214 prior to t1. In some examples, when the potential present at the node 246 is less than a voltage present at the node 244 plus a forward bias voltage of the backgate diode of the transistor 210, the transistor 266 is turned on by increasing a value of the signal present at the node 275. In other examples, the transistor 266 is turned on after passage of a predefined period of time for recharging the capacitor 212 and the capacitor 214. In such examples, the predefined period of time may expire before or after the potential present at the node 246 is less than a voltage present at the node 244 plus a forward bias voltage of the backgate diode of the transistor 210. Turning on the transistor 266 discharges any remaining charge at the node 246 (e.g., charge at the gate capacitance of the HSFET 228) to the node 274.

Figure 6:
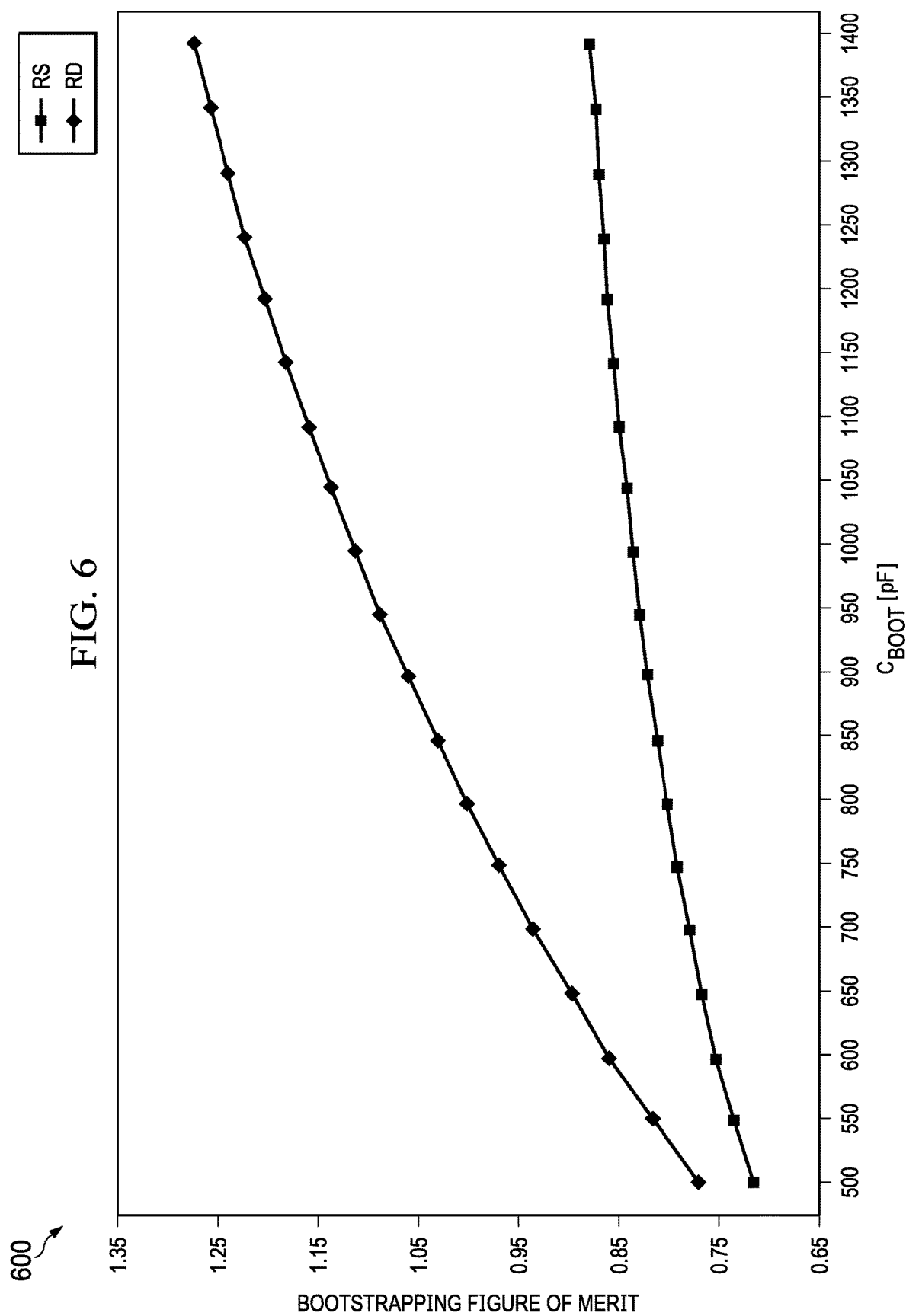
FIG. 6 shows a diagram illustrating a comparison of single to multi bootstrap circuits in accordance with various examples.

Turning now to FIG. 6, a diagram 600 illustrating a comparison of single to multi bootstrap circuits is shown. In at least some examples, the diagram 600 illustrates at least some advantages of the present disclosure, such as at least some advantages of implementation of the circuit 200 of FIG. 2. For example, as described herein, a bootstrap circuit utilizing more than one bootstrap capacitor may have certain benefits over a bootstrap circuit utilizing a single bootstrap capacitor, even if a total effective capacitance of the bootstrap circuit is approximately the same.

As discussed above, to use an nFET in place of a pFET as a HSFET of a switching device operating at low supply voltages, the nFET is bootstrapped to provide a sufficient gate-to-source voltage for operation of the nFET. In a first order approximation, an achievable high-side gate-source voltage is a function of the size of the bootstrap capacitor ($C_{BOOT}$), the gate capacitance of the high-side transistor ($C_{GATE}$) and the supply voltage VIN. It adheres to the equation (1).

$$V_{GS} = \frac{C_{BOOT}}{C_{BOOT} + C_{GATE}} * V_{IN} = RS * V_{IN} \qquad (1)$$

The term RS is a bootstrapping figure of merit or ratio that asymptotically approaches 1 as $C_{BOOT}$ approaches infinity, as shown in the diagram 400 for $C_{GATE}$=200 pF.

The diagram 600 further shows that the gain from increasing $C_{BOOT}$ diminishes as the absolute value of $C_{BOOT}$ rises, making it very area consuming (e.g., large capacitance and large physical area consumption for $C_{BOOT}$) to achieve a bootstrapping figure of merit greater than 0.8. Assuming a worst case threshold voltage of a high-side nFET of 1.8V, in order to achieve a gate-to-source voltage of 1.8V at a supply voltage of 1.8V, RS=1 is required. Taking into account a size of $C_{BOOT}$ without disproportionally increasing die area, RS=0.8 is achievable. This means that the minimal supply voltage to merely turn on the nFET (e.g., achieve a gateto-source voltage at or above the threshold voltage) is 2.25V (e.g., 1.8V/0.8), thus limiting the minimal supply voltage of a device to 2.25V.

As further shown by the diagram 600, a solution to this limit to the minimal supply voltage that exceeds the worst case threshold voltage of a high-side nFET is to use more than one (e.g., such as two) bootstrap capacitors. Consider charge sharing between capacitor $C_A$ (representing the bootstrap capacitor) and capacitor $C_B$ (representing the gate capacitance of the high side transistor). Assume that capacitor $C_A$ is charged to voltage $V_A$ while capacitor $C_B$ is carrying no charge and thus has 0V across its terminals. Assume the negative plates of both $C_A$ and $C_B$ are coupled to ground. When coupling the top plates of these capacitors, charge will flow from $C_A$ to $C_B$. This flow of charge creates a voltage equilibrium $V_{AB}$ across the two capacitors according to the following equation (2), which then redefines RS according to equation (3).

$$V_{AB} = \frac{C_A}{C_A + C_B} * V_A \quad (2)$$

$$RS = \frac{C_A}{C_A + C_B} \quad (3)$$

Now, assume capacitor $C_A$ is split into two equal capacitors $C_{A1}$ and $C_{A2}$ ($C_{A1}=C_{A2}=0.5*C_A$). Both are charged to voltage $V_A$. Conditions of capacitor $C_B$ remain as discussed previously. The negative plates of all three capacitors are coupled to ground. Now, first, the capacitors $C_{A1}$ and $C_{A2}$ are stacked. For example, the bottom plate of capacitor $C_{A2}$ is coupled with the top plate of capacitor $C_{A1}$, resulting in series coupling $C_{A1A2}$ of the two capacitors. The series coupling has an approximate capacitance according to equation (4).

$$C_{A1A2}=0.5*C_{A1}=0.5*C_{A2}=0.5*0.5*C_A=0.25*C_A \quad (4)$$

The voltage across this series coupling approximately equals $2*V_A$. When coupling the top plate of capacitor $C_{A1A2}$ to the top plate of capacitor $C_B$, charge will flow from capacitor $C_{A1A2}$ to capacitor $C_B$, creating a voltage equilibrium $V_{A1A2B}$ across the two capacitors according to the following equation (5), which is a modification of equation (2). Further, a bootstrapping figure of merit for a bootstrapping circuit utilizing two approximately equal capacitance and series coupled capacitors is determined according to the equation (6), which is a modification of the equation (3).

$$V_{A1A2B} = \frac{C_{A1A2}}{C_{A1A2} + C_B} * 2 * V_A = \frac{0.25 * C_A}{0.25 * C_A + C_B} * 2 * V_A \quad (5)$$

$$RD = \frac{0.25 * C_A}{0.25 * C_A + C_B} * 2 \quad (6)$$

Coefficients RS and RD describe the ratios between initial capacitor voltage $V_A$ and the resulting voltages $V_{AB}$ and $V_{A1A2B}$, respectively. Using the same variable names as for equation (1), equation (5) translates to the following equation (7).

$$V_{GS} = \frac{\frac{C_{BOOT}}{4}}{\frac{C_{BOOT}}{4} + C_{GATE}} * 2 * V_{IN} = RD * V_{IN} \quad (7)$$

Compared to RS which asymptotically approaches 1, RD asymptotically approaches 2 when $C_{BOOT}$ approaches infinity. The diagram 600 shows the value of RS (e.g., one bootstrap capacitor) and RD (e.g., two bootstrap capacitors) over $C_{BOOT}$ for $C_{GATE}$=200 pF. For the two capacitor approach, $C_{BOOT}$ is the sum of the capacitances of the two bootstrap capacitors. For example, for $C_{BOOT}$=1000 pF for RS, there is one 1000 pF capacitor. For $C_{BOOT}$=1000 pF for RD, there are two 500 pF capacitors.

As shown in the diagram 600, advantages exist for the two (or more) capacitor bootstrap circuit over the one capacitor bootstrap circuit. For example, for a same value of $C_{BOOT}$, the two (or more) capacitor bootstrap circuit achieves a higher bootstrapping figure of merit. This higher bootstrapping figure of merit translates to a higher gate-to-source voltage of the high-side nFET. The higher gate-to-source voltage further translates to a lower drain-to-source resistance of the high-side nFET and therefore more efficient operation. Additionally, in the two (or more) capacitor bootstrap circuit, a smaller value of $C_{BOOT}$ achieves a same bootstrapping figure of merit as a larger value of $C_{BOOT}$ for the one capacitor bootstrap circuit. In this way, the two (or more) capacitor bootstrap circuit consumes less die area, and therefore decreases cost, when compared to the one capacitor bootstrap circuit. In at least one example, the two (or more) capacitor bootstrap circuit may reduce die area by about 8.2% when compared to a one capacitor bootstrap circuit (e.g., for $C_{BOOT}$=630 pF).

Figure 7:
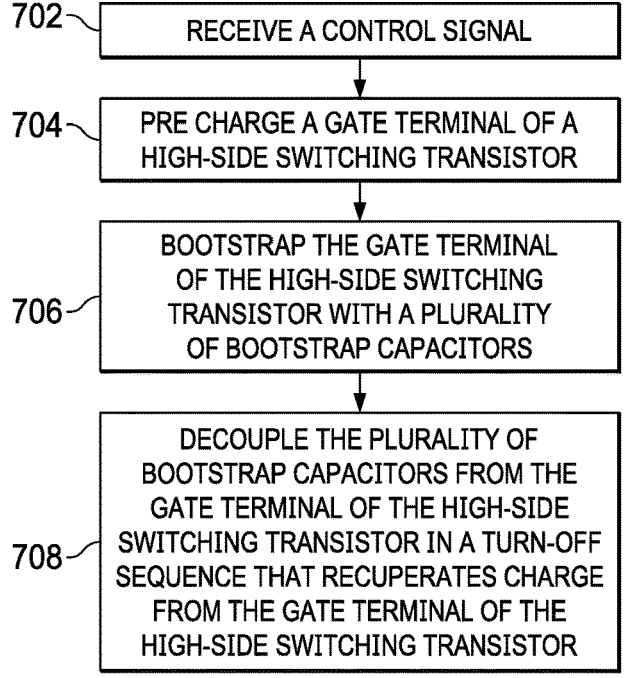
FIG. 7 shows a flowchart of an illustrative method of bootstrap circuit control in accordance with various examples.

Turning now to FIG. 7, a flowchart of an illustrative method 700 of bootstrap circuit control is shown. In at least some examples, the method 700 is implemented to control at least some components of the circuit 200 of FIG. 2. In various examples, some operations of the method 700 may be performed by components of the circuit being controlled, while other operations of the method 700 may be performed by another component, such as a controller.

At operation 702, a control signal is received. The control signal, in at least some examples, is a control signal for controlling a switching transistor. The switching transistor may be a component of a power converter or any other device that includes high-side and low-side switching transistors. When the control signal is asserted, the circuit controls the high-side transistor to turn on and when the control signal is de-asserted, the circuit controls the high-side transistor to turn off.

At operation 704, the circuit precharges a gate terminal of the high-side switching transistor. In at least some examples, the circuit precharges the gate terminal of the high-side switching transistor by coupling a first capacitor to the gate terminal of the high-side switching transistor. The first capacitor transfers stored energy to the gate terminal of the high-side switching transistor to charge a gate capacitance of the high-side switching transistor. The high-side switching transistor turns on, electrically coupling its source and drain nodes when the charge stored by the gate capacitance exceeds a threshold. While turning on, the high-side switching transistor undergoes commutation until the high-side switching transistor is operating in a linear region of operation.

At operation 706, the circuit bootstraps the gate terminal of the high-side switching transistor with a plurality of bootstrap capacitors. In at least some examples, bootstrapping the gate terminal of the high-side switching transistor generates a voltage present at the gate terminal of the high-side switching transistor that is greater than an input voltage of the system minus a threshold voltage of the high-side switching transistor. For example, to bootstrap the gate terminal of the high-side switching transistor, one or more switches of the circuit are controlled to turn on. When turned on, the switches electrically couple a plurality of bootstrap capacitors in series between an input voltage node of the circuit and the gate terminal of the high-side switching transistor. Utilizing a plurality of bootstrap capacitors rather than a single bootstrap capacitor may have certain benefits, as discussed elsewhere herein.

In at least some examples, at least some of the switches of the circuit are controlled by the circuit itself rather than by a signal source outside the circuit. For example, based on a value of VIN and the voltage present at the gate terminal of the high-side switching transistor, the circuit controls at least some of the switches to bootstrap, or not bootstrap, the gate terminal of the high-side switching transistor. In this way, the gate terminal of the high-side switching transistor may not be bootstrapped until the high-side switching transistor is operating in the linear region of operation and VIN is stable.

At operation 708, the circuit decouples the plurality of bootstrap capacitors from the gate terminal of the high-side switching transistor in a turn-off sequence that recuperates charge from the gate terminal of the high-side switching transistor. For example, charge was previously passed from the plurality of bootstrap capacitors to the gate terminal of the high-side switching transistor, at least some of which was stored by a gate capacitance of the high-side switching transistor. By controlling a turn-off sequence of the circuit that de-couples the plurality of bootstrap capacitors from the gate terminal of the high-side switching transistor, at least some of that charge can be recuperated. The recuperated charge is passed back to, and stored by, at least some of the plurality of bootstrap capacitors. Recuperating at least some of the charge from the gate terminal of the high-side switching transistor may have certain benefits, as discussed elsewhere herein.

While the operations of the method 700 have been discussed and labeled with numerical reference, in various examples the method 700 includes additional operations that are not recited herein. In some examples any one or more of the operations recited herein include one or more sub-operations (e.g., such as intermediary comparisons, logical operations, output selections such as via a multiplexer, format conversions, determinations, etc.). In some examples any one or more of the operations recited herein is omitted. In some examples any one or more of the operations recited herein is performed in an order other than that presented herein (e.g., in a reverse order, substantially simultaneously, overlapping, etc.). Each of these alternatives is intended to fall within the scope of the present disclosure.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may include structural features for re-configuration by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, etc.), these components may be exchanged for components of other process technologies (e.g., replace FET and/or MOSFET with BJT, replace n-type with p-type or vice versa, etc.) and reconfiguring circuits including the replaced components to provide desired functionality at least partially similar to functionality available prior to the component replacement. Additionally, when a transistor is said to provide a signal to a node, in at least some implementations the provision of that signal may cause a change in value of the signal, such as by a diode drop or other losses associated with the transistor. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit comprising:
   a first transistor having a first current terminal, a second current terminal, and a first control terminal;
   a first capacitor having a first capacitor terminal and a second capacitor terminal, the first capacitor terminal coupled to the first current terminal;
   a second capacitor having a third capacitor terminal and a fourth capacitor terminal, the fourth capacitor terminal coupled to the second current terminal;
   a second transistor having a third current terminal, a fourth current terminal, and a second control terminal, the third current terminal coupled to the second capacitor terminal;

a third transistor having a fifth current terminal, a sixth current terminal, and a third control terminal, the fifth current terminal coupled to the fourth capacitor terminal;

a fourth transistor having a seventh current terminal, an eighth current terminal and a fourth control terminal, the eighth current terminal coupled to the second capacitor terminal; and a control circuit coupled to the seventh current terminal, the fourth current terminal, and the first control terminal.

2. The circuit of claim 1, further comprising a signal selection circuit coupled to the third control terminal.

3. The circuit of claim 1, further comprising a diode stack coupled between the first control terminal and the fourth capacitor terminal.

4. The circuit of claim 1, further comprising:
a fifth transistor having a ninth current terminal, a tenth current terminal, and a fifth control terminal, the tenth current terminal coupled to the third capacitor terminal; and
a sixth transistor having an eleventh current terminal, a twelfth current terminal, and a sixth control terminal, the eleventh current terminal coupled to the third capacitor terminal.

5. The circuit of claim 4, further comprising:
a seventh transistor having a thirteenth current terminal, a fourteenth current terminal, and a seventh control terminal, the thirteenth current terminal coupled to the twelfth current terminal;
an eighth transistor having a fifteenth current terminal, a sixteenth current terminal, and an eighth control terminal, the fifteenth current terminal coupled to the sixth control terminal; and
a ninth transistor having a seventeenth current terminal, an eighteenth current terminal, and a ninth control terminal, the seventeenth current terminal coupled to the sixteenth current terminal, the eighteenth current terminal coupled to the fourteenth current terminal, and the ninth control terminal coupled to the eighth control terminal.

6. The circuit of claim 4, further comprising a high side field effect transistor (HSFET) having a high side control terminal coupled to the twelfth current terminal.

7. A circuit comprising:
a first transistor having a first current terminal, a second current terminal, and a first control terminal;
a first capacitor having a first capacitor terminal and a second capacitor terminal, the first capacitor terminal coupled to the second current terminal;
a second transistor having a third current terminal, a fourth current terminal, and a second control terminal, the third current terminal coupled to the second capacitor terminal;
a filter coupled between the first current terminal and the second control terminal; and
a second capacitor having a third capacitor terminal and a fourth capacitor terminal, the third capacitor terminal coupled to the fourth current terminal.

8. The circuit of claim 7, further comprising an inverter having an inverter input and an inverter output, the inverter output coupled to the first control terminal.

9. The circuit of claim 8, further comprising a switching transistor coupled to the inverter input.

10. The circuit of claim 8, further comprising:
a third transistor having a fifth current terminal, a sixth current terminal, and a third control terminal, the fifth current terminal coupled to the inverter input;
a third capacitor having a fifth capacitor terminal and a sixth capacitor terminal, the sixth capacitor terminal coupled to the sixth current terminal; and
a fourth transistor having a seventh current terminal, an eighth current terminal, and a fourth control terminal, the eighth current terminal coupled to the fifth capacitor terminal.

11. The circuit of claim 10, further comprising a signal selection circuit coupled to the fourth control terminal and to the first control terminal.

12. The circuit of claim 8, further comprising:
a fifth transistor having a ninth current terminal, a tenth current terminal, and a fifth control terminal, the tenth current terminal coupled to the filter and the fifth control terminal coupled to the third capacitor terminal;
a fourth capacitor having a seventh capacitor terminal and an eighth capacitor terminal, the seventh capacitor terminal coupled to the ninth current terminal; and
a sixth transistor having an eleventh current terminal, a twelfth current terminal, and a sixth control terminal, the twelfth current terminal coupled to the eighth capacitor terminal and the sixth control terminal coupled to the fourth capacitor terminal.

13. A method comprising:
pre-charging, by a bootstrap circuit, a switching transistor gate of a switching transistor using a bootstrap capacitor of bootstrap capacitors;
bootstrapping, by the bootstrap circuit, the switching transistor gate using the bootstrap capacitors responsive to receiving an input voltage; and
recharging at least one of the bootstrap capacitors based on a charge stored in a switching transistor gate capacitance when the bootstrap circuit turns off the switching transistor.

14. The method of claim 13, wherein bootstrapping the switching transistor gate is performed responsive to a control signal.

15. The method of claim 14, further comprising producing, by a control circuit, the control signal based on a signal at the switching transistor gate and based on the input voltage.

16. The method of claim 14, wherein producing the control signal comprises producing the control signal to instruct the bootstrap circuit to bootstrap the switching transistor gate with the bootstrap capacitors after the switching transistor begins operating in a linear region of operation and the input voltage has recovered from an inductive breakdown.

17. The method of claim 16, further comprising controlling a first transistor, a second transistor, and a third transistor to produce a conductive charging path from an input voltage terminal to the switching transistor gate responsive to a value of a signal at the switching transistor gate exceeding a threshold.

18. The method of claim 13, wherein the bootstrap capacitor is a first bootstrap capacitor, the method further comprising:
charging the switching transistor gate in a first charging phase according to a charge stored by the first bootstrap capacitor; and charging the switching transistor gate in a second charging phase according to a charge stored in a second bootstrap capacitor of the bootstrap capacitors.

* * * * *